United States Patent [19]
Seki et al.

[11] Patent Number: 5,485,052
[45] Date of Patent: Jan. 16, 1996

[54] THREE ELECTRODE TYPE SAW LONGITUDINAL COUPLING FILTER

[75] Inventors: Shunichi Seki, Osaka; Kazuo Eda, Nara; Yutaka Taguchi; Keiji Onishi, both of Settsu, all of Japan

[73] Assignee: Matsushita Electric Industrial Co., Ltd., Osaka, Japan

[21] Appl. No.: 366,390

[22] Filed: Dec. 29, 1994

Related U.S. Application Data

[63] Continuation of Ser. No. 60,982, May 14, 1993, abandoned.

[30] Foreign Application Priority Data

May 14, 1992 [JP] Japan ..................................... 4-121607

[51] Int. Cl.⁶ .............................. H03H 9/64; H01L 41/08
[52] U.S. Cl. .................................. 310/313 B; 310/313 A; 310/313 D; 333/193
[58] Field of Search ......................... 310/313 A, 313 B, 310/313 D; 333/193, 195

[56] References Cited

U.S. PATENT DOCUMENTS

| | | | |
|---|---|---|---|
| 4,247,836 | 1/1981 | Redwood et al. | 333/193 |
| 5,179,310 | 1/1953 | Satoh et al. | 310/313 B |
| 5,212,420 | 5/1993 | Hickernell et al. | 310/313 D |
| 5,349,260 | 9/1994 | Anemogiannis et al. | 310/313 D |
| 5,351,022 | 9/1994 | Ruile et al. | 333/195 |
| 5,392,013 | 2/1995 | Yamamoto et al. | 333/195 |

FOREIGN PATENT DOCUMENTS

| | | | |
|---|---|---|---|
| 0202114 | 12/1982 | Japan | 333/195 |
| 0230418 | 10/1986 | Japan | 333/195 |
| 0231417 | 9/1989 | Japan | 333/193 |
| 3296316 | 12/1991 | Japan | 333/195 |
| WO91/09464 | 6/1991 | WIPO | H03H 9/64 |
| 9109464 | 6/1991 | WIPO | 333/195 |

OTHER PUBLICATIONS

"High Performance Saw Filters with Several New Technologies for Cellular Radio", Hikita et al., IEEE 1984, pp. 82–92.
"900 MHz Range Wideband Double Mode SAW Filters", Morita et al., pp. 7–14 w/2 drawings, May 28, 1992.

*Primary Examiner*—Thomas M. Dougherty
*Attorney, Agent, or Firm*—Wenderoth, Lind & Ponack

[57] ABSTRACT

A three electrode type SAW longitudinal coupling filter includes a piezoelectric substrate having an electromechanical coupling factor ($K^2$) higher than 10% and, three sets in total of input electrodes and output electrodes. Each of the electrodes includes a plurality of a electrode fingers of comb shape and are formed on the piezoelectric substrate. Reflectors are disposed at opposite sides of the input electrodes and output electrodes. The number of pairs of electrode fingers of the input electrodes is differentiated from the number of pairs of electrode fingers of the output electrodes. By the above arrangement, a large pass-band width can be obtained with small ripples and with an increase of the attenuation amount outside the band region.

9 Claims, 8 Drawing Sheets

Ratio of no. of electrode finger pairs of input electrode to output electrode

Fig. 4

Reflector pitch

THREE ELECTRODE TYPE SAW LONGITUDINAL COUPLING FILTER

This application is a Continuation of now abandoned application, Ser. No. 08/060,982, filed May 14, 1993.

BACKGROUND OF THE INVENTION

The present invention generally relates to an electrical filter and more particularly to an elastic surface wave filter arranged to propagate elastic surface acoustic waves (SAWs) on a substrate of a piezoelectric material for selectively deriving a predetermined frequency band region.

Recently, following a reduction in size and weight for movable communication equipment, demand for three electrode type SAW longitudinal coupling filter has been increasing, and such filters that have low loss and are superior in attenuation characteristics outside the band region are particularly required.

The following is a description of a conventional elastic surface wave filter. The fundamental type of the elastic surface wave filter generally includes a piezoelectric substrate of ST-cut crystal, 128° Y-cut X propagation lithium niobate or 36° Y-cut X propagation lithium tantalic acid, and each one of comb-shaped input electrode and comb-shaped output electrode provided on said piezoelectric substrate. However, the comb-shaped electrodes which effect energy conversion between electricity and an a surface acoustic wave have a bi-directional characteristic, and the energy converted from the electrical signal to the surface acoustic wave at the input electrode is propagated not only in the direction of the output electrode, but also in the reverse direction. For eliminating such an inconvenience, elastic surface wave filters of a resonator type and a multi-electrode type, etc., have been conventionally proposed.

In the resonator type, it is intended to maintain a pass-band region at a low loss by coupling the elastic surface resonator including reflectors for enclosing the surface acoustic wave disposed at opposite sides of the input and output electrodes. As a coupling means of the surface acoustic wave resonator, a multi-mode filter utilizing the longitudinal mode and transverse mode of high order has been used in practical applications. However, in the resonator type using the piezoelectric substrate, it is difficult to achieve a broad pass-band region, since the electromechanical coupling factor of the piezoelectric substrate is small, and further, freedom in design is limited due to simple electrode construction.

In the multi-electrode type, input electrodes and output electrodes are alternately disposed so as to detect the surface acoustic wave which is bi-directionally propagated by the electrodes disposed at the both sides, with another electrode being further disposed at the outer side to achieve low loss. By such a practice, if the number of repetitions of the input electrodes and output electrodes is increased, the amount of loss may be reduced to close to 0, and by a number of repetitions of 4 to 5 times, an amount of loss less than 1 dB may be theoretically obtained. However, although a large freedom in design is available in the multi-electrode type, since the total number of electrode fingers for the input and output electrodes are large, there have been problems in that influences due to multi-path reflection within the electrodes and deviation in phases between the input and output electrodes, etc., appear in the form of ripples within the pass-band region and spurious radiation outside the pass-band region, etc.

A three electrode type surface acoustic wave longitudinal coupling filter has the features of both the resonator type and the multi-electrode type, and generally includes a piezoelectric substrate of ST-cut crystal, 128° Y-cut X propagation lithium niobate or 36° Y-cut X propagation lithium tantalic acid, and input and output electrodes and reflectors provided on said piezoelectric substrate. However, such piezoelectric substrates as referred to above are small in the electromechanical coupling factor related to the pass-band width, and even the substrate of 128° Y-cut X propagation lithium niobate having the largest electromechanical factor has a value of about 5.5%.

Figure 12:
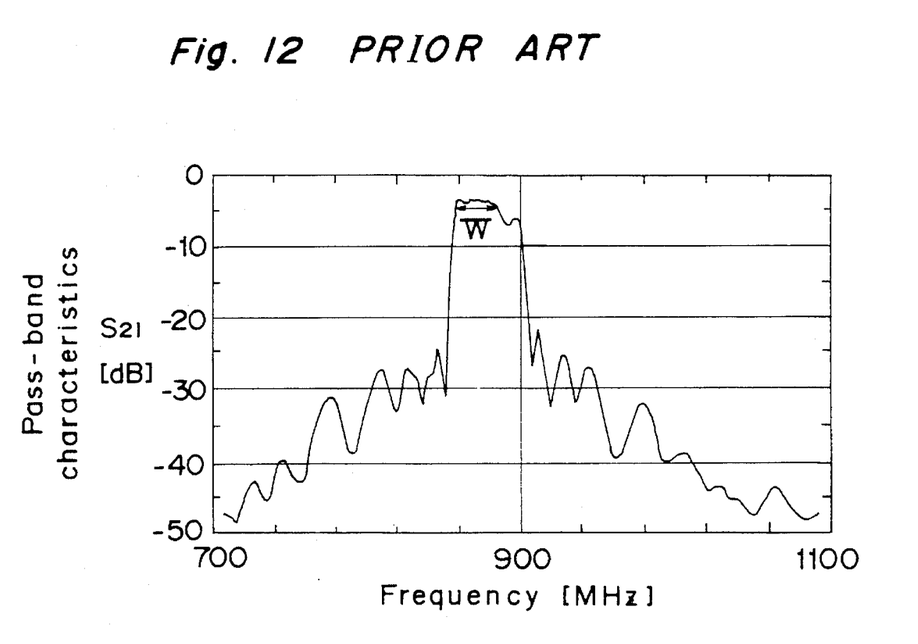
FIG. 12 is a frequency characteristic diagram showing a wave form in a conventional three electrode type SAW longitudinal coupling filter (already referred to).

As is seen from FIG. 12, showing frequency characteristics of a conventional three electrode type surface acoustic wave longitudinal coupling filter constituted by a piezoelectric substrate of 36° Y-cut X propagation lithium tantalic acid having an electromechanical coupling factor of 5%, regular type two input and one output electrodes, in which the number of pairs of input electrode fingers is 21, that of the output electrode fingers is 30, and reflectors of 150 pieces are respectively short-circuited and provided on said piezoelectric substrate, the ripples within the pass-band region become large as the pass-band width is broadened.

As described so far, in the conventional arrangements there has been the problem that it is difficult to maintain the practical pass-band width sufficiently large due to limitations in the number of pairs of electrode fingers affecting the frequency characteristics.

SUMMARY OF THE INVENTION

Accordingly, an essential object of the present invention is to provide a three electrode type SAW longitudinal coupling filter which is capable of achieving a large pass-band width with small ripples, and an increased attenuation amount outside the band region, with substantial elimination of disadvantages inherent in the conventional filters of this kind.

Another object of the present invention is to provide a three electrode type SAW longitudinal coupling filter of the above described type which is simple in construction and stable in function with high reliability, and which can be readily manufactured at low cost.

In accomplishing these and other objects, according to one preferred embodiment of the present invention, there is provided a three electrode type SAW longitudinal coupling filter which includes a piezoelectric substrate having an electromechanical coupling factor ($K^2$) higher than 10%, three total sets of input electrodes and output electrodes respectively including a plurality of pairs of electrode fingers (I.D.T. (inter-digital transducer pair)) of a comb shape, and formed on the piezoelectric substrate and reflectors disposed at opposite sides of the input electrodes and the output electrodes. The number of pairs of electrode fingers of the input electrodes is differentiated from the number of pairs of electrode fingers of the output electrodes.

By the arrangement of the present invention as described above, a three electrode type SAW longitudinal coupling filter which can provide a large pass-band width with small ripples and an increased attenuation amount outside the band region as compared with frequency characteristics of the conventional a three electrode type SAW longitudinal coupling filter has been advantageously presented.

BRIEF DESCRIPTION OF THE DRAWINGS

These and other objects and features of the present invention will become apparent from the following description taken in conjunction with the preferred embodiments thereof and with reference to the accompanying drawings, in which.

DETAILED DESCRIPTION OF THE INVENTION

Before the description of the present invention proceeds, it is to be noted that like parts are designated by like reference numerals throughout the accompanying drawings.

(Embodiment 1)

Figure 1A:
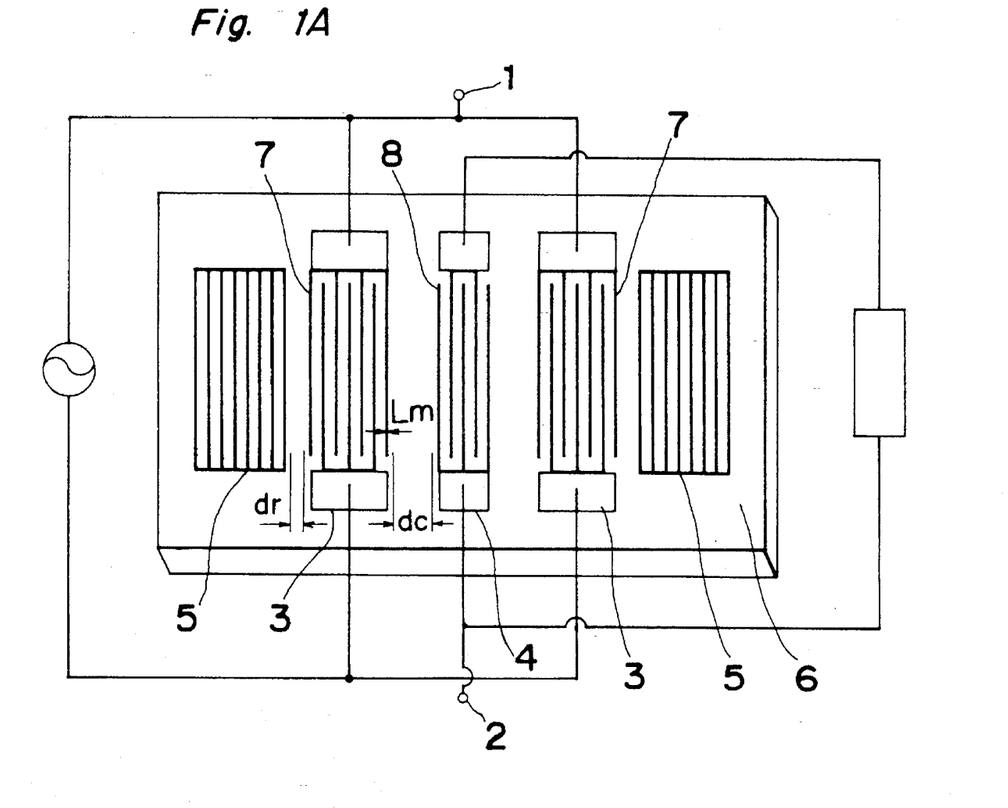
FIG. 1A is a schematic fragmentary top plan view showing the construction of input and output electrodes and reflectors of a three electrode type SAW longitudinal coupling filter according to first and second embodiments of the present invention.
Figure 1B:
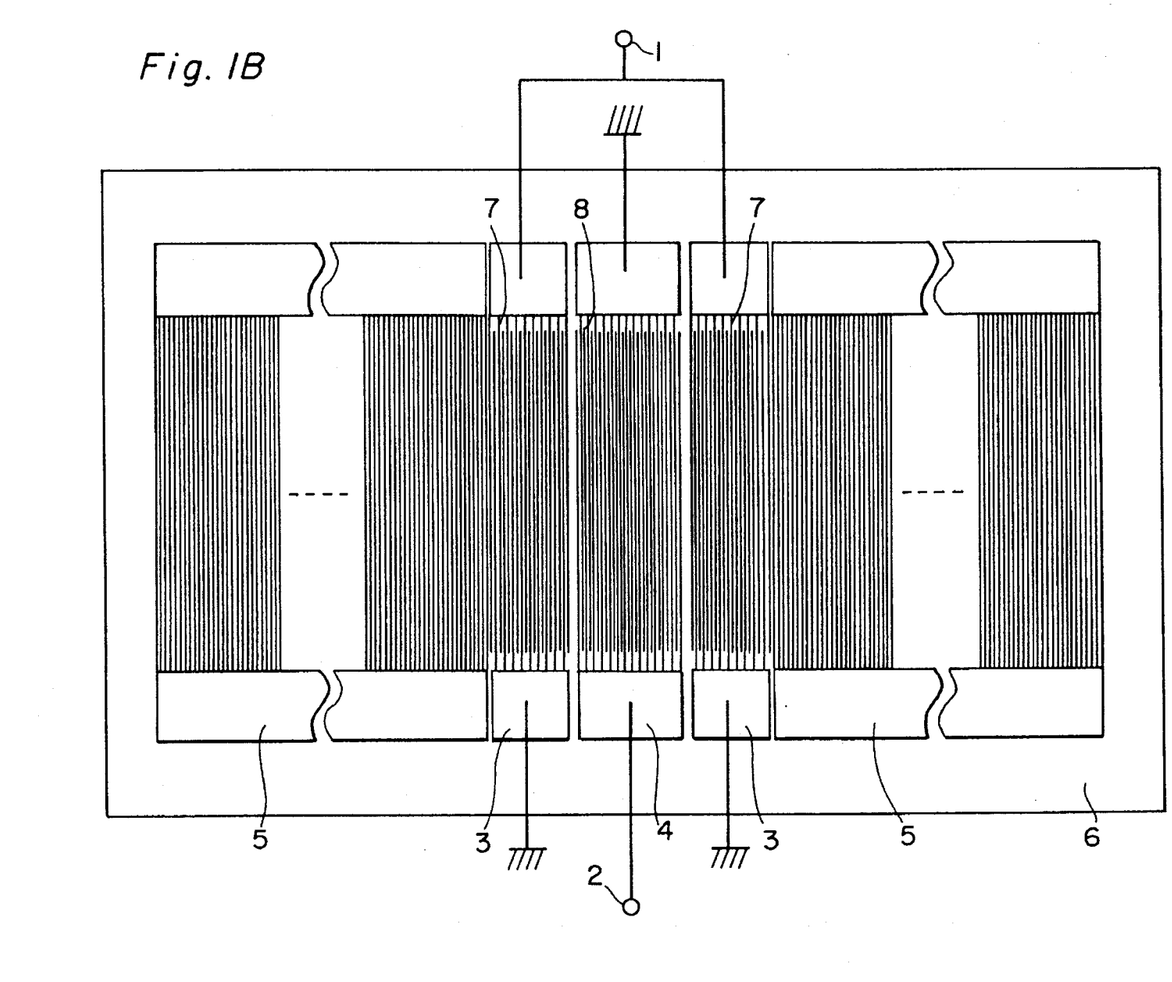
FIG. 1B is similar to FIG. 1A, but shows different numbers of input and output electrodes.
Figure 2:
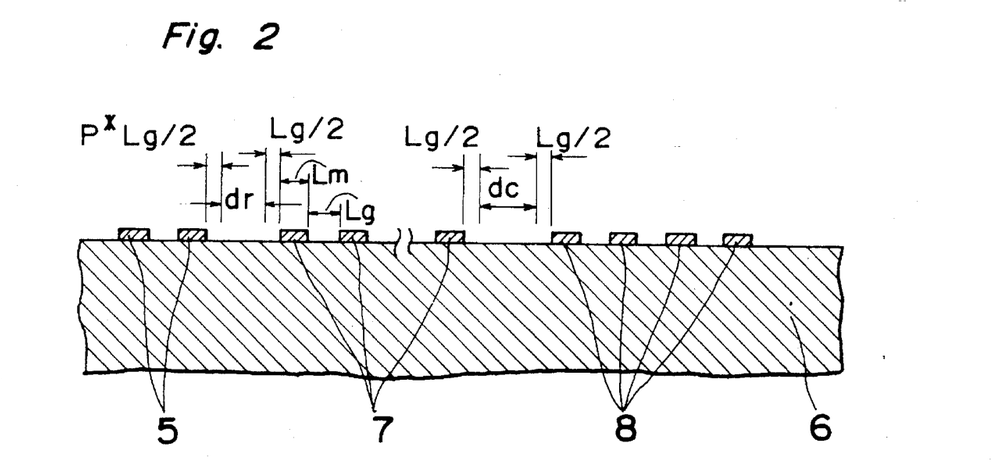
FIG. 2 is a schematic fragmentary cross section at part of a three electrode type SAW longitudinal coupling filter of FIG. 1A.

Referring now to the drawings, there is shown in FIGS. 1 and 2 a three electrode type SAW longitudinal coupling filter according to one preferred embodiment of the present invention which generally includes a piezoelectric substrate 6 having an electromechanical coupling factor ($K^2$) higher than 10%, three total sets of electrodes, including input electrodes 3 and an output electrode 4 respectively including a plurality of electrode fingers 7 and 8 of a comb shape, and formed on the piezoelectric substrate 6. The electrode fingers 7 and 8 of the input electrodes 3 and the output electrode 4 confront and inter-digitate each other with a predetermined interval. The electrode fingers 7 of the input electrodes 3 and the electrode fingers 8 of the output electrode 4 are respectively connected to an input terminal 1 and an output terminal 2, and differentiated from each other in the number of pairs of the electrode fingers 7 and 8. A pair of reflectors 5 are provided on the piezoelectric substrate 6 disposed at respective opposite sides of the input electrodes 3 and the output electrode 4, as shown.

In FIGS. 1A and 2, Lm represents a width of the electrode finger, Lg denotes a width of an interval between the electrode fingers, dc shows a propagation path length of the confronting input electrode 3 and the output electrode 4, dr indicates a propagation path length of the reflector 5 and the input electrode 3 or output electrode 4 adjacent to the reflector 5, and p represents a pitch of the reflector. The propagation path length dc is as shown in FIG. 2, i.e. a certain distance located in the space between adjacent electrode fingers of the input and output electrodes and buffered by distances Lg/2 on either side thereof. The propagation path length dr is also as shown in FIG. 2, i.e. a distance located between adjacent electrode fingers of the input or output electrodes and the reflector electrodes with distances Lg/2 and pLg/2 on both sides thereof, respectively.

The reflector pitch p shows that the electrode finger width Lm and the width Lg of the interval between the electrode fingers of the reflector 5 are, respectively, p times the electrode finger width Lm and the width Lg of the interval between the electrode fingers of the input electrode 3 and the output electrode 4. In other words, the reflector pitch p times the electrode finger width Lm of the input electrodes 3 and the output electrodes 4 results in the electrode finger width Lm of the electrode fingers of the reflector 5, and the reflector pitch p times the electrode finger interval width Lg of the input electrodes 3 and the output electrodes 4 results in the electrode finger interval width Lg of the electrode fingers of the reflector 5.

Figure 9:
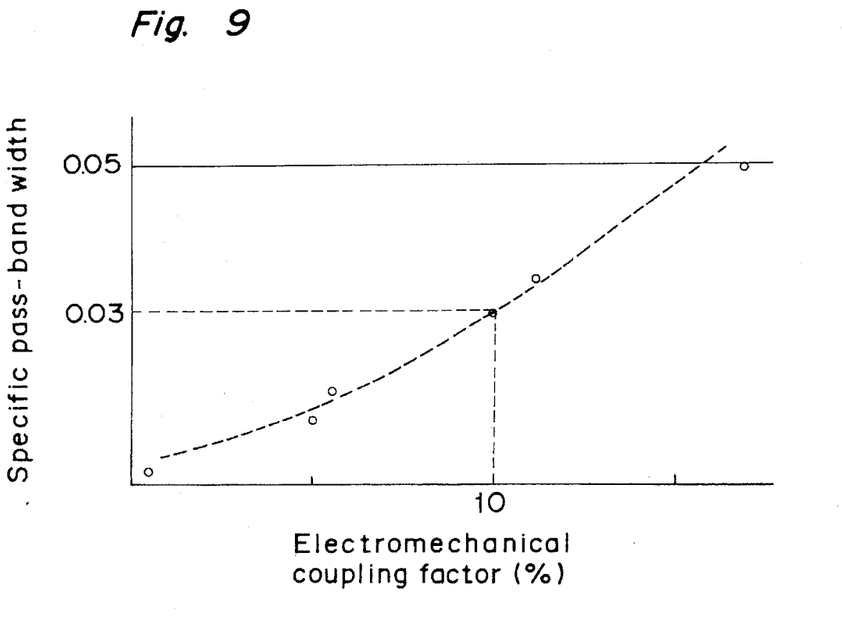
FIG. 9 is a graphical diagram the showing relation between the electromechanical coupling factor of the piezoelectric substrate of the three electrode type SAW longitudinal coupling filter of the present invention and the specific pass-band width thereof.

FIG. 9 shows the result of an investigation made into the relation between the electromechanical coupling factor and specific pass-band width with respect to three electrode type surface acoustic wave coupling filters in which respective electrodes as described above are disposed on various piezoelectric substrates different in their electromechanical coupling factors.

As can be seen from FIG. 9, as the electromechanical coupling factor becomes larger, the specific pass-band width is also increased in proportion thereto. Since the specific pass-band width required for a filter of movable communication equipment at 800 $MH_z$ band is larger than about 0.03, it is seen that an electromechanical coupling factor higher than 10% will be sufficient for an piezoelectric substrate 6.

Accordingly, in the present invention, a 41° Y-cut X propagation lithium niobate substrate with the electromechanical coupling factor of 17.2% was employed for the piezoelectric substrate. However, a 64° Y-cut propagation lithium niobate may also be employed.

The numbers of pairs of the electrode fingers (or number of I.D.T. (inter-digital transducer) pairs for the input electrodes 3 and the output electrode 4 determine fundamental frequency characteristics of the three electrode type SAW longitudinal coupling filter.

Figure 3:
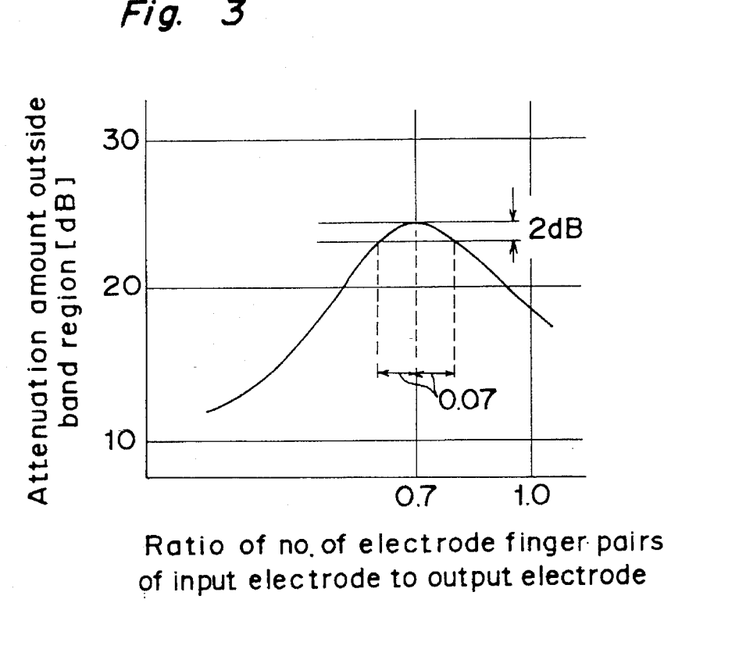
FIG. 3 is a graphical diagram showing the relation between a ratio of the number of pairs of electrode fingers for the input and output electrodes of the three electrode type SAW longitudinal coupling filter of the present invention, and an attenuation amount outside the band region thereof.

Particularly when attention is directed to the attenuation amount outside the band, a large attenuation amount can be achieved when the number Ni of the pairs of the electrode fingers of the input electrode 3 is not equal to the number No of the pairs of electrode fingers of the output electrode 4, and according to experiments carried out by the present inventors, the largest attenuation amount outside the band region could be obtained when the ratio Ni/No of the numbers of the electrode fingers of the input and output electrodes was 0.70, as shown in FIG. 3. The three electrode type SAW longitudinal coupling filter of FIG. 1B shows each input electrode 3 having electrode fingers 7 in the ration of 0.70 to the number of electrode fingers of the output electrode 4. It is to be noted here, however that, since the ratio in the numbers of the pairs of the electrode fingers of the input and output electrodes is limited to a large extent in order to set the ratio Ni/No at 0.70, said ratio Ni/No is set in said range of 0.70±0.07, with 2 dB regarded as an allowance.

Meanwhile, since the three electrode type surface acoustic wave longitudinal coupling filter is adapted to generate a standing wave between the reflectors 5 at the opposite sides of the filter the through the utilization of resonance of the surface acoustic wave, the filter characteristics thereof are largely affected by the distance between the electrode finger centers between the input and output electrodes, and the input and output electrodes and reflectors 5, and also by the pitch p of the reflectors 5. By the study of the relation between the respective propagation path lengths dc and dr referred to earlier and the filter frequency characteristics in the case where the input and output electrode finger and reflector pitch p are equal, the results as shown in Table 1 below were obtained in terms of wave forms. The respective propagation path lengths dc and dr are presented in Table 1 as ratios thereof to the electrode finger periodicity L.

TABLE 1

| dc/L<br>dr/L | 0 | 0.25 | 0.50 | 0.75 | 1.00 |
|---|---|---|---|---|---|
| 0 | B | A | B | A | B |
| 0.25 | b | a | b | a | b |
| 0.50 | B | A | B | A | B |
| 0.75 | b | a | b | a | b |
| 1.00 | B | A | B | A | B |

Figure 10:
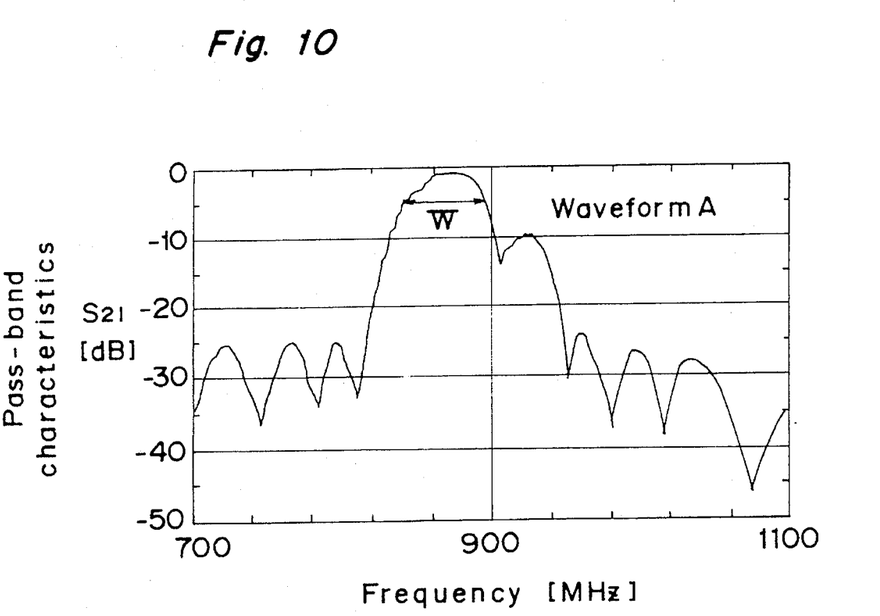
FIG. 10 is a frequency characteristic diagram showing a wave form with a large pass-band width based on a propagation path length of the three electrode type SAW longitudinal coupling filter according to the first embodiment of the present invention.
Figure 11:
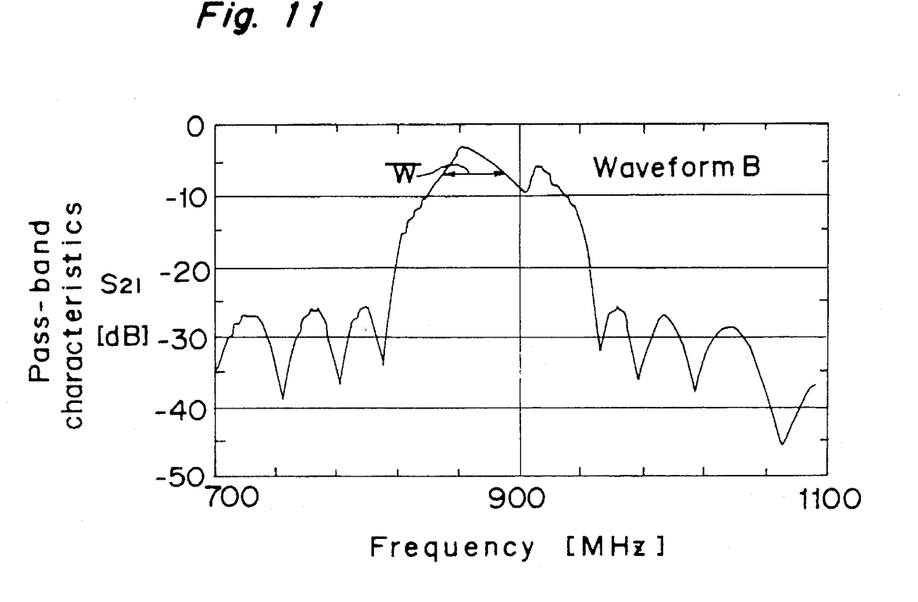
FIG. 11 is a frequency characteristic diagram showing a wave form with the smallest pass-band width based on a propagation path length of the surface acoustic wave filter according to the first embodiment of the present invention.

In the above Table 1, a symbol A shows that the frequency characteristics with a waveform wide in the pass-band width W appear as shown in FIG. 10, while a symbol B denotes the appearance of the frequency characteristics with a waveform which is the narrowest in the pass-band width W as shown in FIG. 11.

The variation of the propagation path lengths dc and dr corresponding to the variations from the waveform of FIG. 10 to that of FIG. 11, and from the waveform of FIG. 11 to that of FIG. 10, appear continuously as the variation of the pass-band width.

Symbols a and b in Table 1 show that frequency characteristics having waveforms that closely resemble those of FIGS. 10 and 11 respectively, but which are unworthy of evaluation due to very large ripples within the pass-band region having appeared.

Frequency characteristics having the largest pass-band width, with small ripples within the band region were obtained when the propagation path lengths dc and dr satisfy either of equations below.

$$dc=(\alpha+m/2) \cdot L$$

$$dr=(\beta+n/2) \cdot L$$

$$\alpha=0.25\pm0.05$$

$$\beta=0+0.05(n=0)$$

$$\beta=0\pm0.05(n>0)$$

$$m, n=0, 1, 2, 3, \ldots$$

It is to be noted that the range of $\alpha$ and $\beta$ in the above equations relate to the case where an allowance of the pass-band width is set at 10%.

Figure 4:
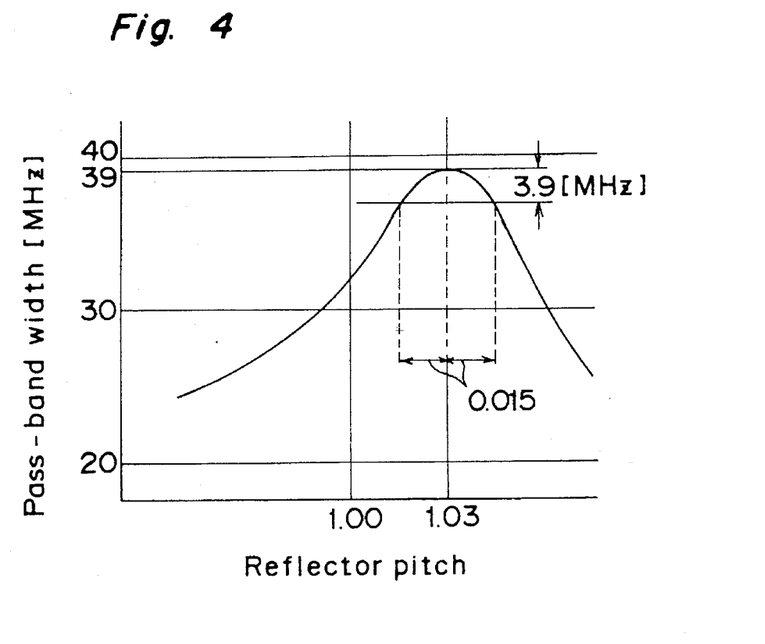
FIG. 4 is a graphical diagram showing the relation between a pitch of reflectors and a pass-band width of the three electrode type SAW longitudinal coupling filter of the present invention.

In the propagation path lengths dc and dr, when the pitch p of the reflector 5 is varied so as to correspond to the pass-band width, the largest pass-band width could be obtained when the pitch of the reflector 5 was 1.03, as shown in FIG. 4. It is noted that the range of the pitch p (±0.015) reflector 5 relates to the case where the allowance of the pass-band width was set at 10% in a the similar manner to the propagation path length. The reflectors thus comprise reflector electrode fingers having a width of 1.030, ±0.015, times the width of the electrode fingers of the input electrodes and the output electrodes and having an interval between the reflector electrode fingers 1.03, ±0.015, times the interval between the electrode fingers of the input electrodes and the output electrodes. Thus as can be seen in FIG. 4, at the reflector pitch 1.03, there is a maximum pass-band width of 39 MHz. With the allowance of the pass-width set at 10%, a 3.9 MHz (10% of 39 MHz) allowance is made, as illustrated at the top of the curve in FIG. 4. This allows for the range of the pitch p to be 1.03±0.015, as also illustrated in FIG. 4.

Figure 5:
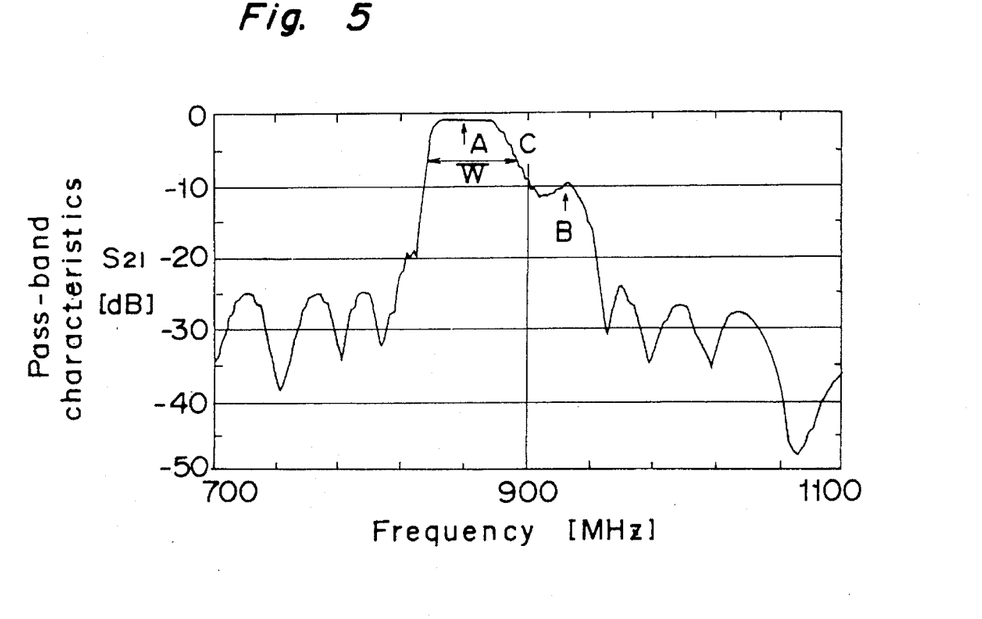
FIG. 5 is a frequency characteristic diagram of three electrode type SAW longitudinal coupling filter according to a first embodiment of the present invention.

The frequency characteristics of the three electrode type surface acoustic wave longitudinal coupling filter constituted by the ratio Ni/No of the numbers of pairs of the electrode fingers of the input and output electrodes, the propagation path lengths dc and dr, and the pitch p of the reflector, which are restricted as above, are shown in FIG. 5.

In FIG. 5, fine spurious radiation is generated outside the band region immediately at the high frequency side of the pass-band region indicated by the symbol C. This is due to the fact that on the 41° Y-cut X propagation lithium niobate substrate, the propagation speed difference of the surface acoustic wave on the free surface and metal surface is large, and the phase difference of the surface acoustic wave on both of the surfaces becomes large. The frequency shown by the symbol A is the frequency which is calculated from the propagation speed of the surface acoustic wave on the metal surface and the electrode periodic length, and the frequency represented by the symbol B is the frequency calculated from the propagation speed of the surface acoustic wave on the free surface and electrode periodic length. In the above case, the the width Lm of the electrode finger is 1.27 [μm], width Lg of the interval between the electrode fingers is 1.27 [μm], the periodicity length L of the electrode finger is 5.08 [μm], intersecting the width of the electrode fingers is 40L, the number Ni of pairs of the electrode fingers for the input electrodes is 9.5, the number No of pairs of the electrode fingers for the output electrode is 13.5, the ratio Ni/No is 0.70, the number of reflectors is 150 pieces, the propagation path length dc is 1.27 [μm] ($\alpha=0.25$, m=0), the propagation path length dr is 0.00 [μm] ($\beta=0$, m=0), and the pitch p is 1.030.

As described so far, according to the present embodiment, when compared with the frequency characteristics of the conventional three electrode type surface acoustic wave longitudinal coupling filter as shown in FIG. 12, large a pass-band width with small ripples can be achieved, while superior frequency characteristics large in the attenuation amount outside of the band region can be advantageously obtained.

(Embodiment 2)

A second embodiment according to the present invention will now be described.

In this embodiment, the three electrode type surface acoustic wave longitudinal coupling filter has a piezoelectric substrate and a construction similar to those of the first embodiment, but the electrode design has been changed as described hereinbelow.

Figure 6:
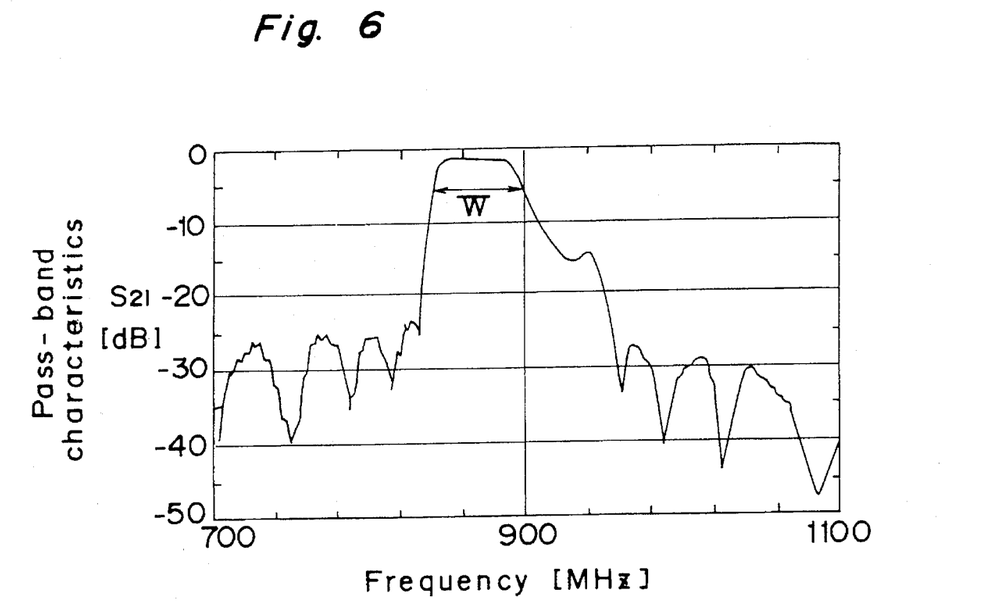
FIG. 6 is a frequency characteristic diagram of the three electrode type SAW longitudinal coupling filter according to a second embodiment of the present invention.
Figure 7:
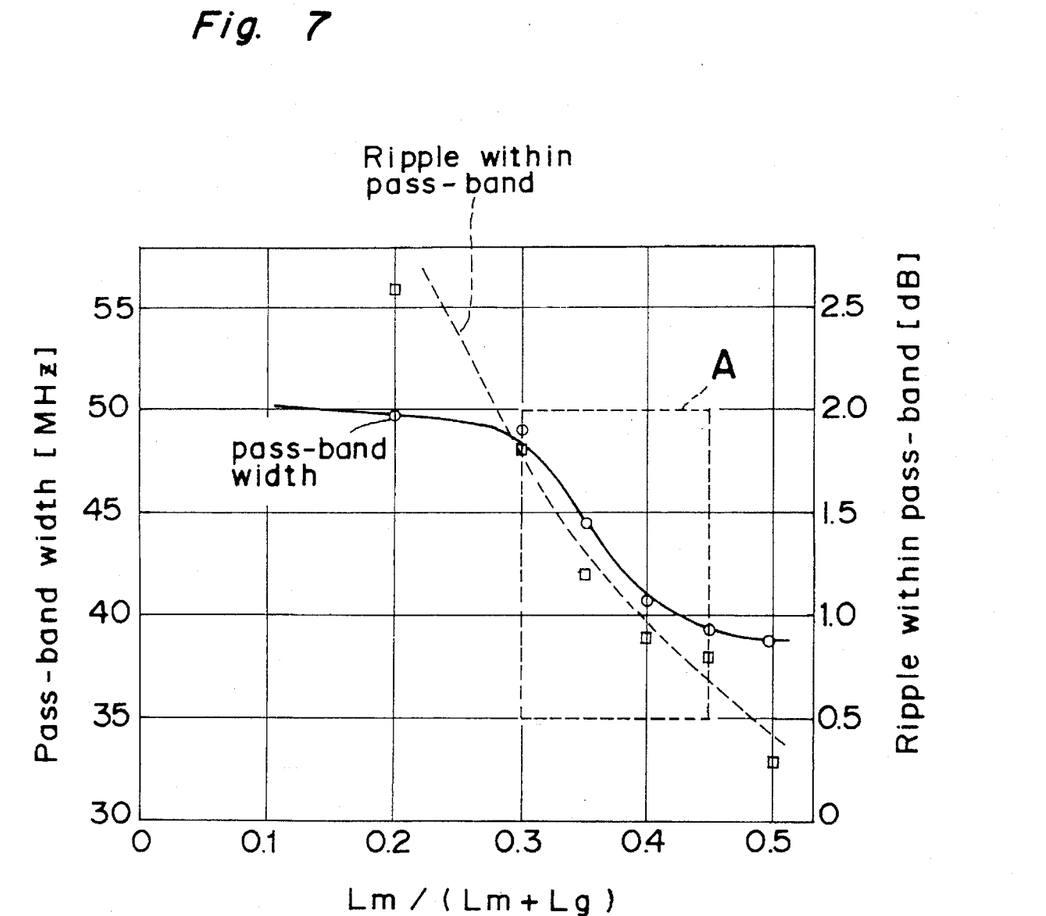
FIG. 7 is a graphical diagram showing the relation among the electrode finger width of the input and output electrodes, the occupation rate of the electrode finger width in a unit section of the width of an interval between the electrode fingers, and ripples in the pass-band width or pass-band region.

FIG. 6 shows the frequency characteristics in the case where the width of the electrode finger Lm for the input electrode 3 and output electrode 4, and the occupation rate of the electrode finger width at the unit section of the width of the interval between the electrode fingers Lm/(Lm+Lg) is 0.40, i.e., the electrode finger width Lm is set at 1.016 [μm] and the width Lg of the interval between the electrode fingers is set at 1.524 [μm]. When Lm/(Lm +Lg) is made smaller than 0.5, the fine spurious radiation outside the band region immediately at the high frequency side of the pass band region shown by the symbol C in FIG. 5 disappears, and also, the pass-band width can be made larger. Moreover, when the relation with respect to the pass-band width and ripples within the pass-band is studied, with the value of Lm/(Lm+Lg) being altered, the result is as shown in FIG. 7. As is seen from FIG. 7, although the pass-band width becomes large as the value Lm/(Lm+Lg) is reduced to be smaller than 0.5, the ripples within the band region are increased. In FIG. 7, when the pass-band width is set above 35 [MH$_z$], and the ripples within the pass-band region, below 2 [dB], the value Lm/(Lm+Lg) will be in a range above 0.30 and below 0.45.

As described above, according to the present embodiment, by setting the value for Lm/(Lm+Lg) in the value above 0.30 and below 0.45, it becomes possible to achieve a large pass-band width with small ripples, and also to obtain superior frequency characteristics large in the attenuation amount outside the band region as compared with the conventional three electrode type surface acoustic wave longitudinal coupling filter.

Figure 8:
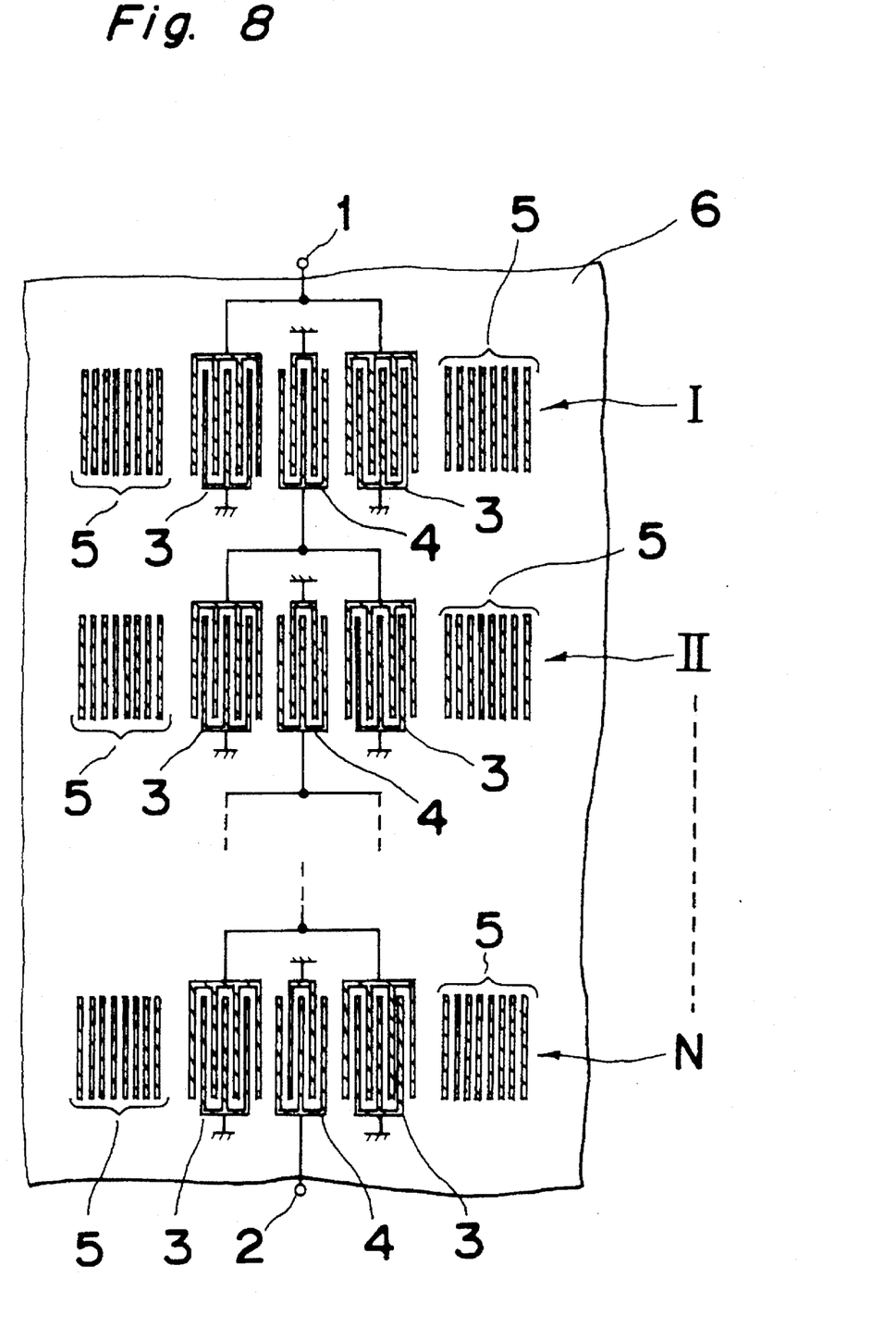
FIG. 8 is a schematic fragmentary top plan view of a combined three electrode type SAW longitudinal coupling filter in which a plurality of the elastic surface wave filters of the first or second embodiment of the present invention are joined in series to each other.

Furthermore, as shown in FIG. 8, by connecting a plurality of the three electrode type surface acoustic wave longitudinal coupling filters of the present invention in series as shown, a still larger attenuation amount outside the band region can be obtained. Similarly, by weighting at least one or more input electrodes or the output electrode with an apodized electrode or thinned-out electrode at least at one portion, a still larger attenuation amount outside the band region can be achieved.

As is clear from the foregoing description, according to the present invention the three electrode type SAW longitudinal coupling filter is provided with a piezoelectric substrate having an electromechanical coupling factor (K$^2$) higher than 10%, the three sets in total of input electrodes and output electrodes, respectively including a plurality of electrode fingers of a comb shape, and formed on the piezoelectric substrate, and the reflectors disposed at opposite sides of the input electrodes and output electrodes, with the number of pairs of electrode fingers of the input electrodes being differentiated from the number of pairs of electrode fingers of the output electrodes and by the above construction, the superior three elecetrode type SAW longitudinal coupling filter having large pass-band width, with small ripples, and increased in the attenuation amount outside the band-region has been advantageously presented.

Although the present invention has been fully described by way of example with reference to the accompanying drawings, it is to be noted here that various changes and modifications will be apparent to those skilled in the art. Therefore, unless otherwise such changes and modifications depart from the scope of the present invention, they should be construed as included therein.

What is claimed is:

1. A three electrode type SAW longitudinal coupling filter, comprising:

a piezoelectric substrate having an electro-mechanical coupling factor higher than 10%;

three sets of electrodes on said piezoelectric substrate, including sets of input electrodes and an output electrode, wherein each of said sets of electrodes comprises a plurality of electrode fingers that confront each other and are interdigitated; and a pair of reflectors on said piezoelectric substrate disposed at respective opposite sides of said input electrodes and said output electrode;

wherein a ratio of the number of pairs of said electrode fingers of each said input electrode to the number of pairs of said electrode fingers of said output electrode is 0.70±0.07;

wherein there is a propagation path length dc between said input electrodes and said output electrode, a propagation path length dr between said reflectors and adjacent ones of said input electrodes and said output electrode, and dc and dr satisfy either dc=(α+m/2)·L or dr=(β+n/2)·L, where α=0.25±0.05, β=0+0.05 (n=0), β=0±0.05 (n>0), and m, n=0, 1, 2, 3, . . . , and L is the periodicity of said electrode fingers of said input electrodes and said output electrode.

2. The three electrode type SAW longitudinal coupling filter of claim 1, wherein said reflectors comprise reflector electrode fingers having a width of 1.030, ±0.015, times the width of said electrode fingers of said input electrodes and said output electrodes and having an interval between said reflector electrode fingers 1.030±0.015, times the interval between said electrode fingers of said input electrodes and said output electrodes.

3. The three electrode type SAW longitudinal coupling filter of claim 1, wherein said input electrodes and said output electrode have an occupation rate, Lm/(Lm+Lg), where Lm is the width of one of said electrode fingers and Lg is the width of an interval between adjacent said electrode fingers, higher than 0.30 and lower than 0.45.

4. The three electrode type SAW longitudinal coupling filter of claim 1, wherein said reflectors comprise reflector electrode fingers having a width of 1.030, ±0.015, times the width of said electrode fingers of said input electrodes and said output electrodes and having an interval between said reflector electrode fingers 1.030, ±0.015, times the interval between said electrode fingers of said input electrodes and said output electrodes, and wherein said input electrodes and said output electrode have an occupation rate, Lm/Lm+Lg), where Lm is the width of one of said electrode fingers and Lg is the width of an interval between adjacent said electrode fingers, higher than 0.30 and lower than 0.45.

5. The three electrode type SAW longitudinal coupling filter of claim 1, 2, 3 or 4, wherein said piezoelectric substrate comprises 41° Y-cut X propagation lithium niobate.

6. The three electrode type SAW longitudinal coupling filter of claim 5, and further comprising a plurality of said three electrode type SAW longitudinal coupling filters connected in series.

7. The three electrode type SAW longitudinal coupling filter of claim 1, 2, 3, or 4, wherein said piezoelectric substrate comprises 64° Y-cut X propagation lithium niobate.

8. The three electrode type SAW longitudinal coupling filter of claim 7, and further comprising a plurality of said three electrode type SAW longitudinal coupling filters connected in series.

9. The three electrode type SAW longitudinal coupling filter of claim 1, 2, 3 or 4 and further comprising a plurality of said three electrode type SAW longitudinal coupling filter connected in series.

* * * * *